US006440778B1

United States Patent
Okada et al.

(10) Patent No.: US 6,440,778 B1
(45) Date of Patent: Aug. 27, 2002

(54) OPTICAL SEMICONDUCTOR ELEMENT PACKAGE AND MANUFACTURING METHOD THEREOF

(75) Inventors: Takahiro Okada; Hideaki Murata; Masato Sakata, all of Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/613,633

(22) Filed: Jul. 11, 2000

(30) Foreign Application Priority Data

Jan. 7, 2000 (JP) .......................... 2000-001644

(51) Int. Cl.[7] .................. H01L 21/44; H01L 21/48; H01L 21/50
(52) U.S. Cl. ................. 438/121; 438/106; 438/107; 438/22; 438/24; 438/27; 438/29; 438/48; 438/64; 257/98; 257/99; 257/432; 257/433; 257/684; 257/678; 385/91; 385/92; 385/94
(58) Field of Search ................. 438/106, 107, 438/121, 51, 24, 27, 22, 25, 26, 29, 48, 64, 125; 257/704, 693, 678, 433, 432, 684, 686, 98, 99, 700; 385/91, 92, 94

(56) References Cited

U.S. PATENT DOCUMENTS 6,163,072 A * 12/2000 Tatoh .......................... 257/704

FOREIGN PATENT DOCUMENTS

JP Sho 62-112389 5/1987
JP Hei 03-280484 12/1991

* cited by examiner

Primary Examiner—Wael Fahmy
Assistant Examiner—Hsien-Ming Lee
(74) Attorney, Agent, or Firm—Oblon, Spivak, McClelland, Maier & Neustadt, P.C.

(57) ABSTRACT

An optical semiconductor element package including a housing, electric signal input and output wiring boards, and external leads. The housing has a metal frame and a metal bottom plate, for storing optical semiconductor elements. The electric signal input and output wiring boards are arranged in the housing at positions so that the optical semiconductor elements are not existent right above and right below the boards. The external leads are drawn to the outside through the side wall of the metal frame. The wiring boards are connected to the external leads and to the optical semiconductor elements by bonding wires. The input and output of an electric signal between the outside and the optical semiconductor elements are carried out through the bonding wires, the wiring boards and the external leads.

9 Claims, 6 Drawing Sheets

OPTICAL SEMICONDUCTOR ELEMENT PACKAGE AND MANUFACTURING METHOD THEREOF

BACKGROUND OF THE INVENTION

1. Field of the Invention

The present invention relates to an optical semiconductor element package and to a manufacturing method thereof.

2. Description of the Background

A conventional optical semiconductor element package is composed of a metal bottom plate 11 and a metal frame 13 fixed to the top of the metal bottom plate to form a housing as shown in the perspective view of FIG. 4 and the plan view of FIG. 5. Optical semiconductor elements such as a semiconductor laser element and Peltier element for cooling the element are mounted on the metal bottom plate 11.

Generally speaking, heat generated from the optical semiconductor elements is cooled by the Peltier element underlying the optical semiconductor elements and exhausted to the outside of a module from a side opposite to the Peltier element through the metal bottom plate 11 in the end.

A window frame 14 to which an optical fiber is attached is installed in the metal frame 13 and an electric signal input and output terminal 12 is attached to each side portion of the metal frame 13. Pads 16 to be bonded to external leads 15 are provided on the outer side of the terminal 12 and pads 17 to be wire bonded to the optical semiconductor elements etc. arranged in the inside of the housing are provided on the inner side of the terminal 12.

In the optical semiconductor element package thus constituted, when the distance of each of bonding wires for connecting the optical semiconductor elements to the pads 17 is too long, inconvenience occurs by loose wires or the like. Therefore, the pads 17 internal to the housing are collected around the semiconductor elements unlike the pads 16 external to the housing.

That is, the pads 17 internal to the housing also function to convert the pitches of the wires. They also function to avoid cross wiring because a short circuit may occur when the bonding wires cross one another.

When it is difficult to provide all the wires on the surface layer portion of a wiring board, a multi-layer substrate is often used for the wiring board (terminal) 12. A metal cover for sealing the housing air-tightly is placed on top of the metal frame 13.

The metal frame 13 is desirably made of a material having a thermal expansion coefficient close to that of the electric signal input and output terminal 12 that is mainly made of a ceramic. An Fe—Ni alloy or Fe—Ni—Co alloy is used as the material.

The electric signal input and output terminal 12 mainly made of ceramic is bonded to the metal frame by brazing or the like. Therefore, as shown in FIG. 6, a bonding portion having four faces (a face A, two faces C and a face D) is metallized. Stated more specifically, pad faces B that become electrodes and the upper and lower faces A and D of the terminal are metallized with W or the like, the bonding portion is cut to a predetermined length, and the cut faces C are metallized with Mo—Mn or the like in most cases.

The metal bottom plate 11 must be made of a material having high heat conductivity because it must have a thermal expansion coefficient close to that of the metal plate 13 and quickly radiate heat generated from the semiconductor laser elements or the like. A Cu—W alloy etc. is used as the material. The metal frame 13 and the metal bottom plate 11 are bonded together by solder.

In the conventional optical semiconductor element package shown in FIG. 4 and FIG. 5 which has been described above, the electric signal input and output terminals 12 which are mainly made of ceramic such as alumina must be attached to the metal frame 13 to keep airtightness. Therefore, it must be mated with a recessed attachment portion formed in the metal frame 13 with an extremely strict dimensional tolerance. However, it is not easy to machine the terminal 12 mainly made of ceramic with an extremely strict dimensional tolerance after the above first step, thereby greatly boosting costs.

The two-stage metallization of four faces (a face A, two faces C and a face D) other than the pad faces as described above costs dear.

To eliminate the above problems, it is conceivable that the wiring board for inputting and outputting electric signals is arranged in the inside of the metal frame 13, the external leads 15 are drawn to the outside through through holes 18 formed in the side portion of the metal frame 13, and the through holes 18 are sealed up with a sealing material such as a glass material.

To this end, bonding portions between the wiring board and the external leads 15, which are external to the metal frame 13, must be incorporated in the metal frame 13. However, as an optical semiconductor module must be small in size, it is impossible to use a metal frame 13 at least larger than a conventional optical semiconductor element package so as to increase the internal space of the metal frame 13.

Meanwhile, to radiate heat generated from the optical semiconductor elements without fail, it is necessary to reduce heat resistance as much as possible between the optical semiconductor elements and the Peltier element and between the Peltier element and the metal bottom plate 11, which form a heat radiation route. A wiring board having low heat conductivity cannot be interposed between them. Further, an optical system for transmitting light emitted from the optical semiconductor elements to an optical fiber without fail must be maintained.

It is also conceivable that the wiring board is eliminated and the external leads 15 and the optical semiconductor elements or the like are directly wire bonded together. However, since the pitch of the external leads 15 is not changed in this case, bonding length becomes larger and inconvenience such as a short circuit caused by loose wires easily occurs.

Therefore, it is necessary to incorporate a wiring board for changing the pitch in the metal frame 13. However, no optical semiconductor element package that satisfies the above restraints and obtains the above effects is yet existent.

In view of the above problems, it is an object of the present invention to provide an inexpensive optical semiconductor element package which has excellent heat radiation properties and prevents a short circuit caused by loose wires.

It is another object of the present invention to provide a method of manufacturing the above optical semiconductor element package.

SUMMARY OF THE INVENTION

According to the present invention, there is provided an optical semiconductor element package including: a housing including a metal frame and a metal bottom plate, for storing optical semiconductor elements; electric signal input and output wiring boards arranged in the housing at positions so that the optical semiconductor elements are not existent right above and right below the boards; and external leads drawn to the outside through the side wall of the metal frame, wherein the wiring boards are connected to the external leads and to the optical semiconductor elements by bonding wires, and the input and output of an electric signal between the outside and the optical semiconductor elements are carried out through the bonding wires, the wiring boards and the external leads.

In this case, the wiring boards can be formed of a glass ceramic material.

In the above optical semiconductor element package, the wiring boards can have upper electrodes to be wire bonded to the optical semiconductor elements on the top surface and lower electrodes to be bonded to the external leads on the under surface, and spacers can be arranged between the metal bottom plate of the housing and the wiring boards.

The spacers can be formed as part of the metal frame or the metal bottom plate. Further, the external leads are drawn to the outside through holes formed in the side portion of the metal frame, and portions around the external leads in the through holes can be sealed up with a sealing material such as a glass material.

According to the present invention, there is also provided a method of manufacturing the above optical semiconductor element package, wherein the spacers are formed integrally with the metal frame or the metal bottom plate by metal injection molding.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

Figure 1:
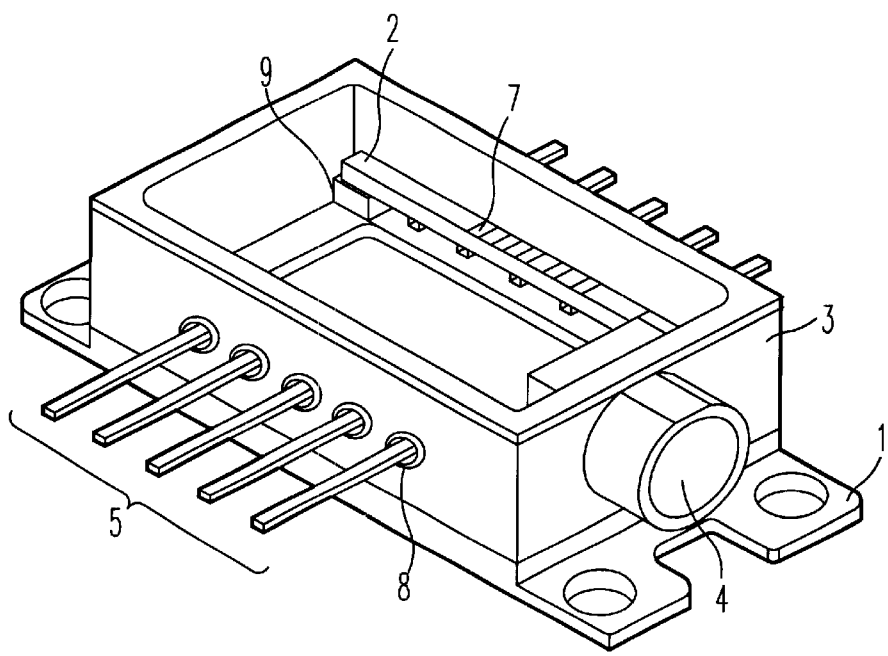
FIG. 1 is a perspective view of an optical semiconductor element package according to an embodiment of the present invention.

The preferred embodiments will now be described with reference to the accompanying drawings, wherein like reference numerals designate corresponding or identical elements throughout the various drawings.

Figure 2:
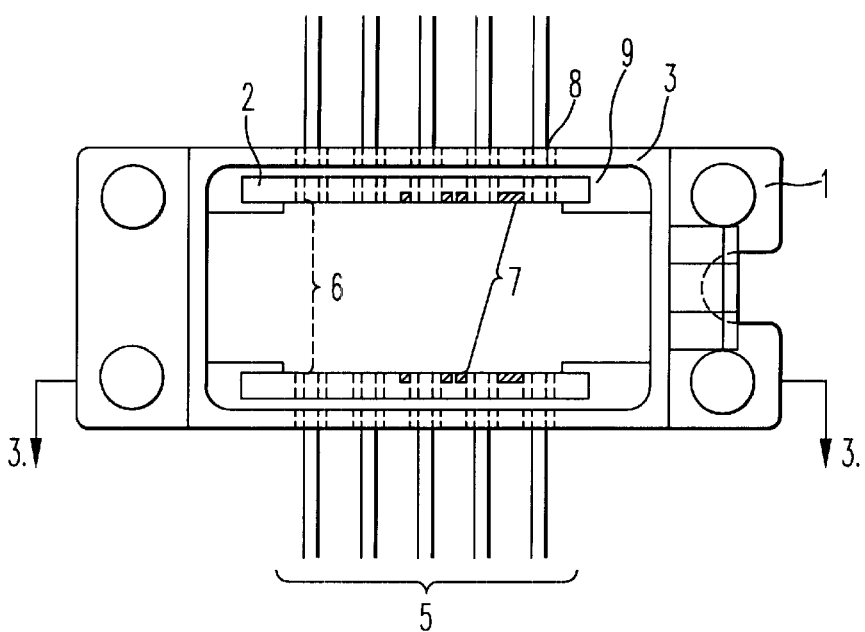
FIG. 2 is a plan view of the optical semiconductor element package according to an embodiment of the present invention.
Figure 3:
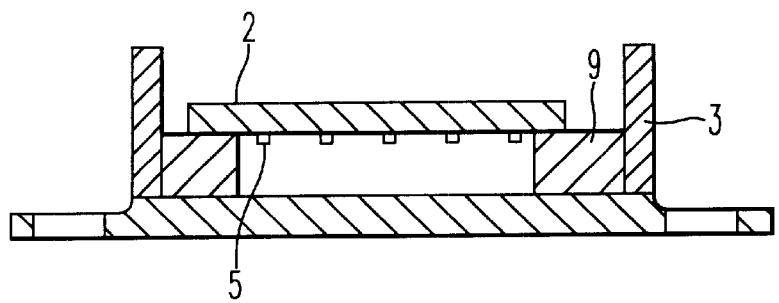
FIG. 3 is a sectional view taken along a line A—A of FIG. 2 showing the optical semiconductor element package according to the embodiment of the present invention.
Figure 4:
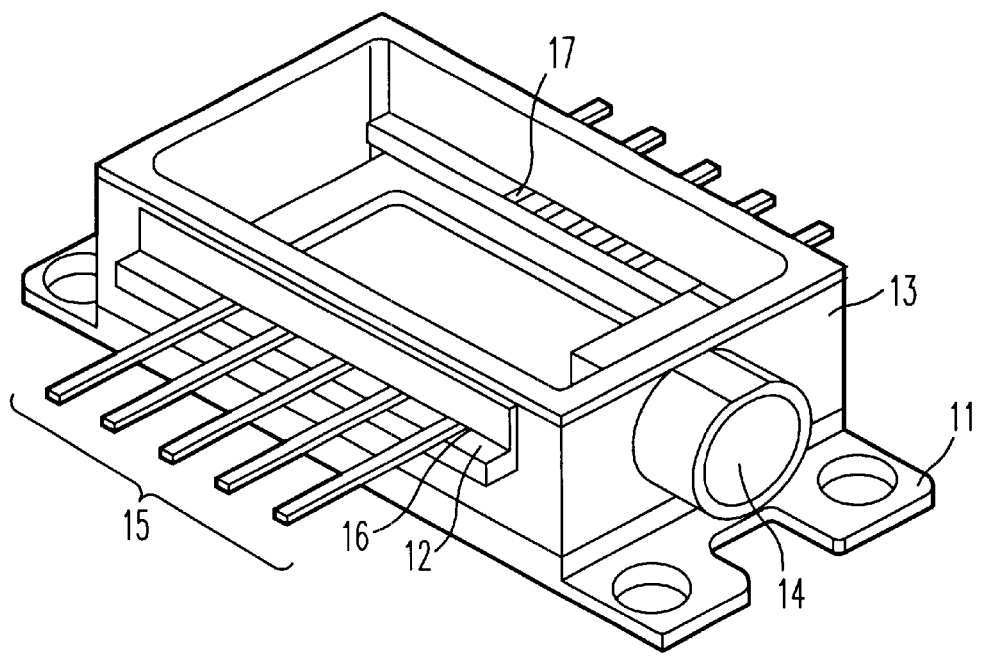
FIG. 4 is a perspective view of an optical semiconductor element package of the prior art.
Figure 5:
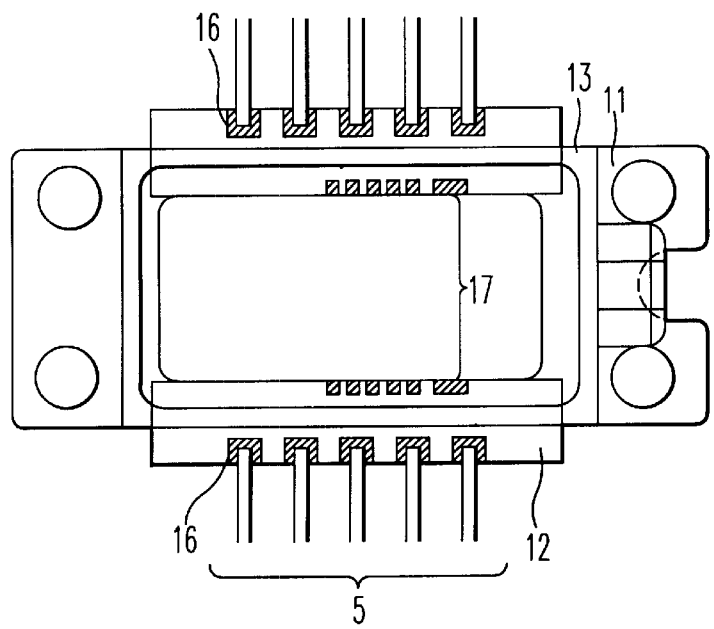
FIG. 5 is a plan view of the optical semiconductor element package of the prior art.
Figure 6:
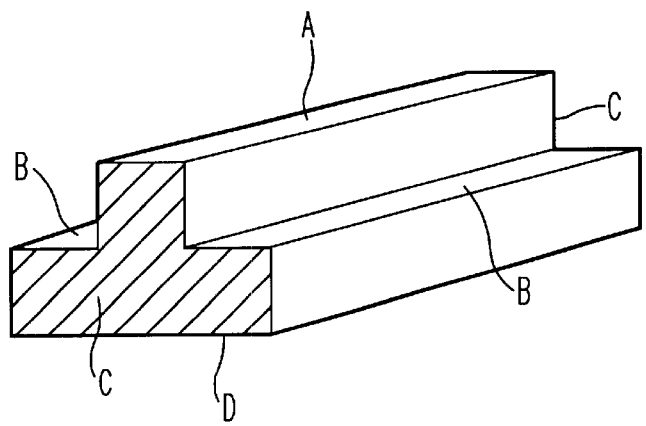
FIG. 6 is a perspective view of an electric signal input and output terminal in the optical semiconductor element package of the prior art.

FIG. 1 is a perspective view of an optical semiconductor element package according to an embodiment of the present invention, FIG. 2 is a plan view thereof, and FIG. 3 is a sectional view taken along a line A—A of FIG. 2. This optical semiconductor element package comprises a metal bottom plate 1 and a metal frame 3 fixed on the metal bottom plate 1 to form a housing as shown in FIGS. 1 to 3. Optical semiconductor elements such as semiconductor laser elements and Peltier element for cooling them are mounted on the metal bottom plate 1. Heat generated from the optical semiconductor elements is cooled by the Peltier element underlying the optical semiconductor elements and finally exhausted to the outside of a module from a side opposite to the Peltier element through the metal bottom plate 1.

Spacers 9 each made of the same material as the metal bottom plate 1 or the metal frame 3 are provided on the metal bottom plate 1 at the four corners of the housing and electric signal input and output wiring boards 2 made of an inorganic material are placed on these spacers 9. The spacers 9 may be formed as part of the metal bottom plate 1 or the metal frame 3, that is, integrated with the metal bottom plate 1 or the metal frame 3. The formation of this integrated unit can be carried out by metal injection molding (MIM), for example.

Pads 6 to be bonded to external leads 5 are provided on the top surfaces or under surfaces of the wiring boards 2 and pads 7 to be wire bonded to the optical semiconductor elements are provided on the top surfaces. The optical semiconductor elements are connected to the pads 7 by bonding wires. Through holes 8 are formed in the side portion of the metal frame 3 and the external leads 5 connected to the pads 6 are drawn to the outside through the through holes 8. Thus, the input and output of electric signals between the optical semiconductor elements and the outside are carried out through the bonding wires, the wiring boards 2 and the external leads 5.

Portions around the external leads in the through holes 8 formed in the side portion of the metal frame 3 are sealed up with a sealing material such as a glass material to keep the air-tightness of the housing consisting of the metal frame 3 and the metal bottom plate 1.

An optical fiber attachment window frame 3 to which an optical fiber is attached is provided in the metal frame 3. This window frame 4 is made of the same material as the metal frame 3 and may be attached by brazing or soldering or formed integrally with the metal frame 3 by injection molding or the like.

The metal frame 3 is desirably made of a material having a thermal expansion coefficient close to that of the electric signal input and output wiring board 2 made of a ceramic material or a glass ceramic material. An Fe—Ni alloy or Fe—Ni—Co alloy is used as the material.

Since the metal bottom plate 1 must have a thermal expansion coefficient close to that of the metal frame 3 and quickly radiate heat generated from semiconductor laser elements or the like quickly, a material having high heat conductivity must be used. A Cu—W alloy or the like is used as the material. The metal frame 3 and the metal bottom plate 1 are bonded together by solder. A metal cover is placed on the top of the metal frame 3 to seal the housing air-tightly.

In the optical semiconductor element package of the present invention constituted as described above, the electric signal input and output wiring boards 2 made of an inorganic material are arranged in the inside of the housing consisting of the metal frame 3 and the metal bottom plate 1. Therefore, compared with the conventional optical semiconductor element package in which each electric signal input and output terminal 2 is fitted in part of the housing, the dimensional tolerance of the wiring board can be relaxed. Therefore, advantageously a wiring board 2 which is not post-processed or slightly post-processed after it is sintered can be used, thereby making it possible to reduce production cost.

Two faces at the maximum must be metallized and one face is required for bonding in particular. In any case, only one treatment is sufficient for the metallization, thereby reducing costs.

The pads 6 are provided on the lowermost surfaces of the wiring boards 2 and bonded to the external terminals 5, thereby making it possible to install the wiring boards 2 in a limited narrow space.

Since the spacers 9 are provided between the both end portions of the wiring boards 2 and the metal bottom place 1 to support the wiring boards 2, even if the external leads are easily bent due to their low rigidity, it is possible to prevent the inclination of the wiring boards 2 caused by the deformation of the external leads by an impact at the time of wire bonding.

Since a grounding portion must be provided in electric wiring in many cases, the spacers 9 are desirably made of a metal material and bonded to the wiring boards 2 made of a metal material. It is desirable to connect the spacers 9 to at least the metal frame 3 or the metal bottom plate 1 through metal-to-metal bonding.

The electric signal input and output wiring boards can be made of a ceramic material, mainly alumina. However, to improve the propagation properties of a high-frequency signal, the electric signal input and output wiring boards are desirably made of glass ceramic (also called low-temperature baked ceramic).

Glass ceramic is a ceramic composite material comprising glass and alumina, such as glass borosilicate. Since it has a low dielectric constant because it contains a small amount of alumina having a relatively high dielectric constant and also has a low firing temperature of 1,000° C. or less, Cu or Ag having excellent conductivity can be used in the wiring layer in place of W which is used in the conventional ceramic terminal. Therefore, an electric signal input and output terminal having the improved propagation properties of a high-frequency signal can be provided.

Since glass ceramic has a low firing temperature and when glass ceramic can be baked in the atmosphere, a metal such as Ag or Ag—Pd is used as a conductive material, an inexpensive electric signal input and output terminal can be obtained.

However, this glass ceramic has such a defect that its strength is lowered when it receives a heat history of 500° C. or more by brazing or the like. Therefore, when terminals (wiring boards) made of glass ceramic are used in the conventional optical semiconductor element package and tensile stress is applied to the external leads 15, the terminals 12 themselves break and thereby the required tensile strength of the external leads cannot be maintained.

In contrast to this, in the optical semiconductor element package of the present invention, after the external lead 5 is inserted into the through hole 8 formed in the metal frame 3, a space around the external lead 5 is sealed up with a sealing material such as a glass material. Therefore, even when stress is applied to the external lead 5, this stress is received by the sealing portion of the through hole 8 in the metal frame 3 but not the bonding portion between the external lead 5 and the electric signal input and output wiring substrate 2. Therefore, even if bonding strength between the external lead 5 and the wiring board 2 is lowered by the increasing embrittlement of the wiring board 2, large stress is not applied to the portion, thereby making it possible to maintain the tensile strength of the external lead 5.

By sealing up the through hole 8 into which the external lead is inserted, the external lead 5 is drawn to the outside without short circuiting the external lead 5 to the housing made of a metal, and the airtightness of the housing consisting of the metal frame 3 and the metal bottom plate 1 can be maintained.

Therefore, employment of the optical semiconductor element package of the present invention brings the electric signal input and output wiring board 2 made of a glass ceramic material having excellent high-frequency characteristics, and an optical semiconductor element package having excellent high-frequency characteristics can be thereby provided.

The spacer between the wiring board 2 and the metal bottom plate 1 can be produced as an independent member but it is economically preferred that it should be formed as part of the metal frame 3 or the metal bottom plate 1. Particularly when the metal frame 3 is formed by metal injection molding (MIM), a one-piece mold of the spacers 9 and the metal frame 3 can be made so that the costs of the spacers 9 can be ignored. Therefore, this enhanced advantage becomes preferable.

As described above, the present invention satisfies all requirements for an optical semiconductor element package and makes it possible to provide an inexpensive optical semiconductor element package.

The following examples are given to further illustrate the effect of present invention.

Embodiment 1

A metal bottom plate 1 made of Cu—W, a metal frame 3 made of covar (Fe—29Ni—17Co (wt %)) and having through holes 8, an optical fiber attachment window frame 4 made of covar, wiring boards 2 mainly made of alumina, plated with Ni, each consisting of four layers and having predetermined portions metallized with W, spacers 9 made of covar and lead frames forming external leads 5 were prepared.

All the members excluding the external leads 5 were set in a carbon jig and assembled together by soldering with Ag at 800° C. under a hydrogen atmosphere. That is, the metal bottom plate 1 was bonded to the metal frame 3, the spacers 9 were bonded to the top of the metal bottom plate 1 at the four corners of the metal frame 3, the wiring boards 2 were bonded to the tops of the spacers 9, and the optical fiber attachment window frame 4 was bonded to the metal frame 3. A Cu—Ag eutectic alloy was used as solder.

The thus obtained structure was plated with Ni and Au, the Au plating of the window sealing portion of the optical fiber attachment window frame 4 and portions which the external leads 5 would be attached to was removed, and lead frames forming external leads plated with Au in advance and a window for maintaining the air-tightness of the optical fiber attachment window frame 4 were set in another carbon jig.

Thereafter, low-melting glass (PbO.SiO$_2$-based) was filled in the through holes 8 and the window sealing portion of the metal frame 3, and an Ag—Cu—Sn—based solder foil was arranged between the external leads 5 and the wiring boards 2 and heated at 580° C. under a nitrogen atmosphere to bond the external leads 5 to the wiring boards 2 and seal the through holes 8 in the side portions of the metal frame 3 and the optical fiber attachment window frame 4 air-tightly.

Predetermined internal parts were installed in the thus obtained package, which was then covered to completely seal up the package air-tightly, serving as an optical semiconductor module. When this optical semiconductor module was operated, there was no problem.

Embodiment 2

A metal frame 3 made of covar and having spacer corresponding portions formed integrally by MIM, a metal bottom plate 1 made of Cu—W, lead frames for forming external leads 5 made of covar, and wiring boards 2 made of glass ceramic comprising PbO.B$_2$O$_3$.SiO$_2$ glass and alumina in a weight ratio of 40:60 and metallized on both sides were prepared.

After the metal frame 3 and the metal bottom plate 1 were soldered together with eutectic Ag solder, the wiring boards 2 and the spacers 9 of the metal frame 3 were soldered together with an Au—Si eutectic alloy and the wiring boards 2 and the external leads 5 were soldered together with an Au—Si eutectic alloy at 400° C. under a nitrogen atmosphere using a carbon jig, and the window sealing portion of the optical fiber attachment window frame 4 and the through holes 8 in the side portions of the metal frame 3 were sealed up with low-melting glass (PbO.B$_2$O$_3$-based).

When the leads of the thus obtained package and a package which was produced in the same manner and whose through holes 8 were not sealed up with glass were pulled, the tensile strength of the former package was about 30 kgf/mm$^2$ which was practically satisfactory and the tensile strength of the latter package was only 5 kgf/mm$^2$ which was not satisfactory.

Therefore, since stress applied to the bonding portions between the wiring boards and the leads can be reduced by sealing up the through holes 8 with glass, it was confirmed that sufficient tensile strength can provided.

Embodiment 3

Figure 7:
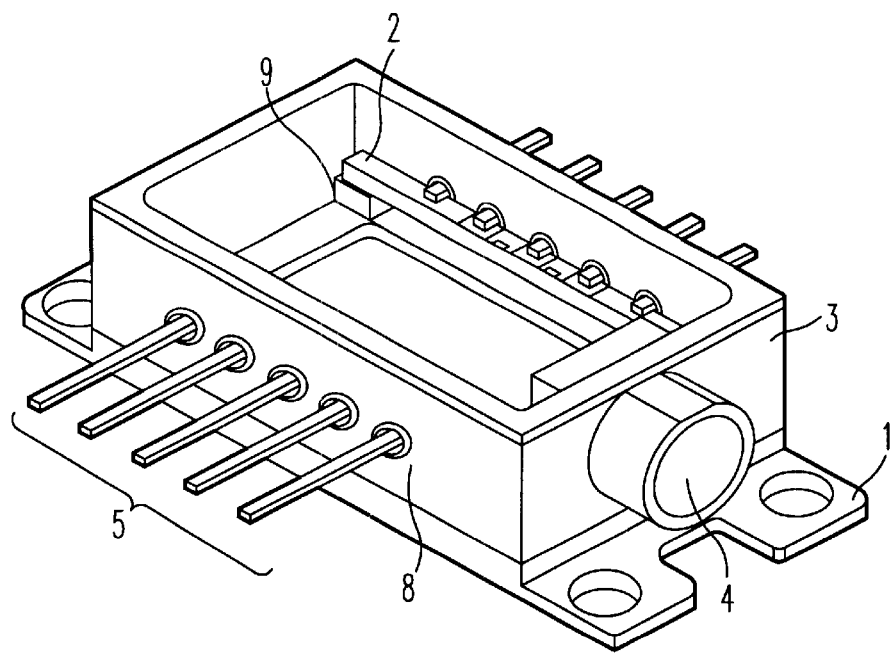
FIG. 7 is a perspective view of an optical semiconductor element package according to another embodiment of the present invention.
Figure 8:
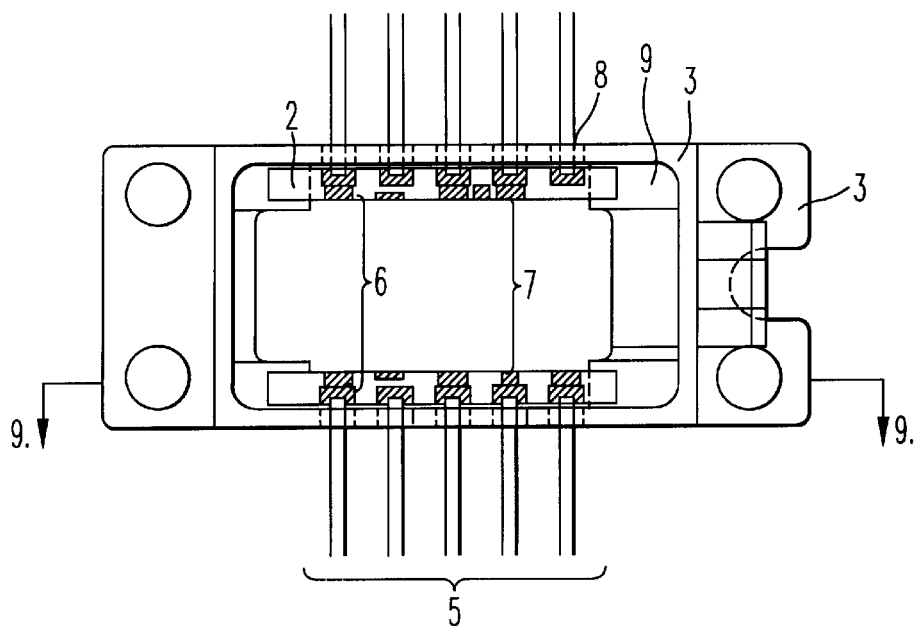
FIG. 8 is a plan view of the optical semiconductor element package according to further another embodiment of the present invention.
Figure 9:
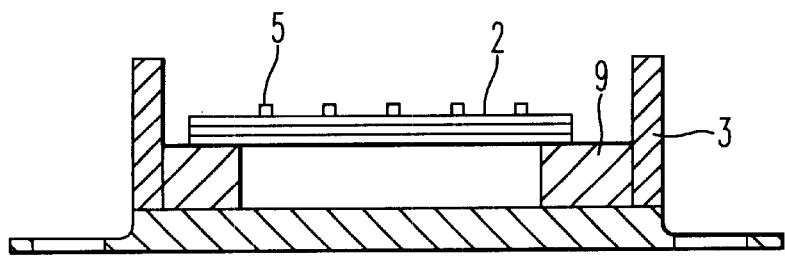
FIG. 9 is a sectional view taken along a line B—B of FIG. 8 showing the optical semiconductor element package according to still another embodiment of the present invention.

A package shown in FIGS. 7 to 9 was produced in the same manner as in Embodiment 1. FIG. 7 is a perspective view of the package of this embodiment, FIG. 8 is a plan view thereof and FIG. 9 is a sectional view taken along a line B—B of FIG. 8.

In the package of Embodiment 1 shown in FIGS. 1 to 3, the pads 6 to be bonded to the external leads 5 were formed on the under surface of the electric signal input and output wiring board 2 and the pads 7 to be wire bonded to the optical semiconductor elements were formed on the top surface of the electric signal input and output wiring board 2. In the package shown in FIGS. 7 to 9, the pads 6 to be bonded to the external leads 5 and the pads 7 to be wire bonded to the optical semiconductor elements were both formed on the top surface of the electric signal input and output wiring board 2.

Predetermined internal parts were installed in the thus obtained package, which was then covered to completely seal up the package air-tightly, serving as an optical semiconductor module. When this semiconductor module was operated, there was no problem.

When a wiring space is not sufficient and wires for connecting the pads 6 and the pads 7 cannot be formed on the substrates in the package shown in FIGS. 7 to 9, the wires can be formed by wire bonding.

Embodiment 4

Figure 10:
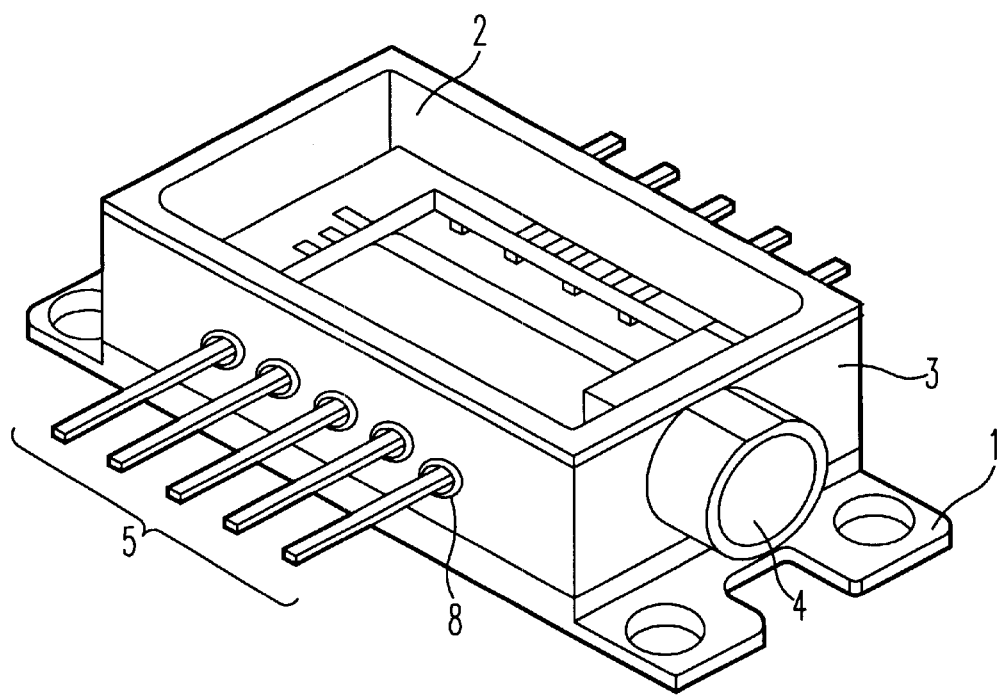
FIG. 10 is a perspective view of an optical semiconductor element package according to yet another embodiment of the present invention.
Figure 11:
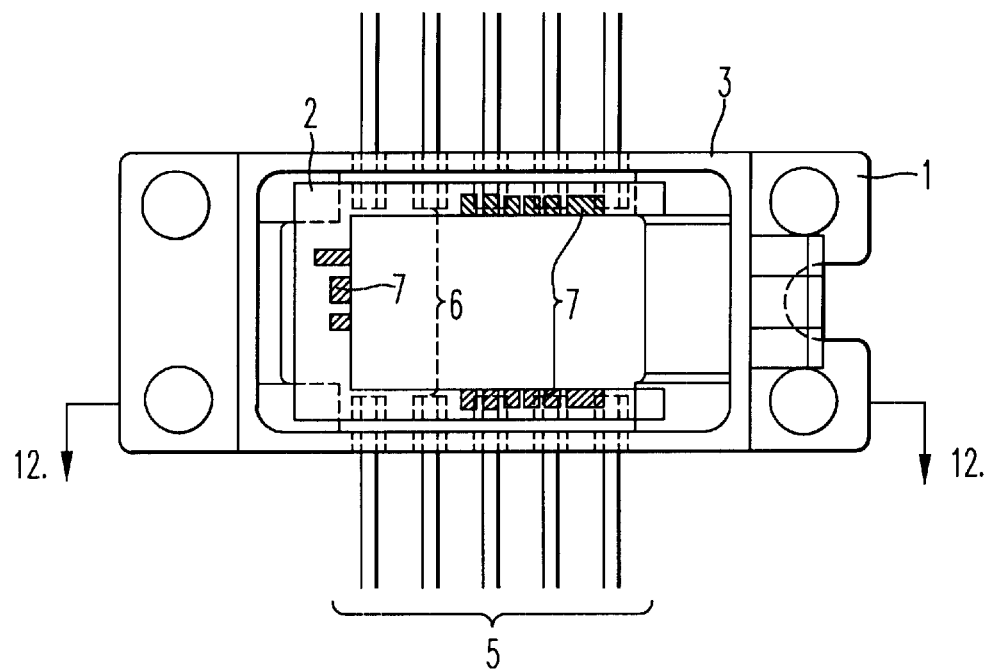
FIG. 11 is a plan view of the optical semiconductor element package according to yet still another embodiment of the present invention.
Figure 12:
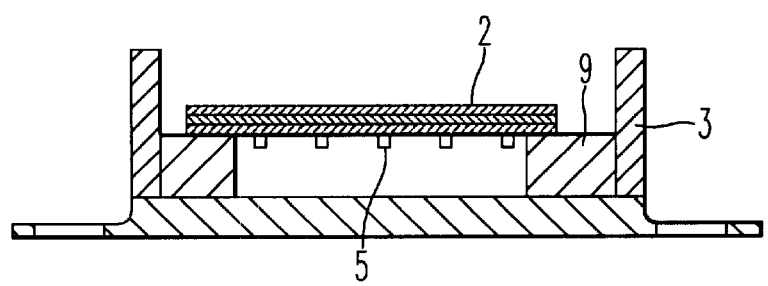
FIG. 12 is a sectional view taken along a line C—C of FIG. 11 showing the optical semiconductor element package according to yet still further another embodiment of the present invention.

A package shown in FIGS. 10 to 12 was produced in the same manner as in Embodiment 1. FIG. 10 is a perspective view of the package of this embodiment, FIG. 11 is a plan view thereof, and FIG. 12 is a sectional view taken along a line C—C of FIG. 11.

In the package shown in FIGS. 10 to 12, right and left electric signal input and output substrates 2 were connected to each other at the rear portion of the package and integrated with each other. That is, the resulting electric signal input and output substrate 2 was U-shaped.

Thus, pads to be wire bonded to an optical semiconductor and the like can be provided in the rear portion in addition to the right and left to theoptical semiconductor elements in the package shown in FIGS. 10 to 12. Therefore, the wiring of the module is easy.

As having been described in detail, according to the present invention, there can be provided an optical semiconductor element package which satisfies requirements and is more inexpensive than the conventional optical semiconductor element package. Further, there can be provided an optical semiconductor element package which have excellent propagation characteristics of a high-frequency signal by using wiring boards made of glass ceramic.

Obviously, numerous modifications and variations of the present invention are possible in light of the above teachings. It is therefore to be understood that, within the scope of the appended claims, the invention may be practiced otherwise than as specifically described herein.

What is claimed as new and is desired to be secured by Letters Patent of the United States is:

1. An optical semiconductor element package comprising:
   a housing including a metal bottom plate and a metal frame having a side wall and configured to store at least one optical semiconductor element;
   electric signal input and output wiring boards configured to be connected to the at least one optical semiconductor element and arranged only in said housing such that the at least one optical semiconductor element is provided on the metal bottom plate without interposing the electric signal input and output wiring boards between the at least one optical semiconductor element and the metal bottom plate; and
   external leads connected to the electric signal input and output wiring boards to be connected to the at least one optical semiconductor element and extending to an outside of the housing through the side wall.

2. An optical semiconductor element package according to claim 1, wherein said wiring boards have a top surface and an under surface and include first electrodes on the top surface and second electrodes on the under surface, and wherein said first electrodes are wire bonded to the optical semiconductor elements, and said second electrodes are bonded to said external leads.

3. An optical semiconductor element package according to claim 1, wherein:
   said wiring boards have a top surface and an under surface and include first electrodes on the top surface and second electrodes on the under surface, and wherein said first electrodes are wire bonded to the optical semiconductor elements, and said second electrodes are bonded to said external leads; and
   spacers are arranged between said metal bottom plate of the housing and said wiring boards.

4. An optical semiconductor element package according to claim 3, wherein said spacers are formed as part of said metal frame or said metal bottom plate.

5. An optical semiconductor element package according to claim 1, wherein said wiring boards have a top surface and an under surface and include first electrodes on the top surface and second electrodes on the under surface, and wherein said first electrodes are wire bonded to the optical semiconductor elements, and said second electrodes are bonded to said external leads, and wherein said wiring boards are made of a glass ceramic material.

6. An optical semiconductor element package according to claim 1, wherein:

said wiring boards have a top surface and an under surface and include first electrodes on the top surface and second electrodes on the under surface, and wherein said first electrodes are wire bonded to the optical semiconductor elements, and said second electrodes are bonded to said external leads;

spacers are arranged between said metal bottom plate of the housing and said wiring boards; and said wiring boards are made of a glass ceramic material.

7. An optical semiconductor element package according to 6, claim wherein said spacers are formed as part of said metal frame or said metal bottom plate.

8. A method for manufacturing an optical semiconductor element package which comprises:

a housing including a metal frame and a metal bottom plate and configured to store optical semiconductor elements;

electric signal input and output wiring boards arranged in said housing at positions at which the optical semiconductor elements do not exist right above and right below the boards;

external leads drawn to an outside through a side wall of the metal frame;

the wiring boards being connected to the external leads and to the optical semiconductor elements by bonding wires, an electric signal between the outside and the optical semiconductor elements being input and output through the bonding wires, said wiring boards and said external leads;

said wiring boards having a top surface and an under surface and including first electrodes on the top surface and second electrodes on the under surface, said first electrodes being wire bonded to the optical semiconductor elements, said second electrodes being bonded to said external leads; and spacers being arranged between said metal bottom plate of the housing and said wiring boards, said method comprising:

forming the spacers integrally with said metal frame or said metal bottom plate by metal injection molding.

9. A method for manufacturing an optical semiconductor element package which comprises:

a housing including a metal frame and a metal bottom plate and configured to store optical semiconductor elements;

electric signal input and output wiring boards arranged in said housing at positions at which the optical semiconductor elements do not exist right above and right below the boards;

external leads drawn to an outside through a side wall of the metal frame;

the wiring boards being connected to the external leads and to the optical semiconductor elements by bonding wires, and an electric signal between the outside and the optical semiconductor elements being input and output through the bonding wires, said wiring boards and said external leads;

said wiring boards having a top surface and an under surface and include first electrodes on the top surface and second electrodes on the under surface, said first electrodes being wire bonded to the optical semiconductor elements, said second electrodes being bonded to said external leads; and spacers being arranged between said metal bottom plate of the housing and said wiring boards, said wiring boards being made of a glass ceramic material, said method comprising:

forming the spacers integrally with said metal frame or said metal bottom plate by metal injection molding.

* * * * *